United States Patent [19]

Diemeer et al.

[11] Patent Number: 5,142,605

[45] Date of Patent: Aug. 25, 1992

[54] INTEGRATED OPTIC COMPONENTS

[75] Inventors: Martinus B. J. Diemeer, Zoetermeer; Winfried H. G. Horsthuis, Dieren, both of Netherlands; Alaster McDonach, Broomhill; John M. Copeland, Glasgow, both of Scotland

[73] Assignee: Barr & Stroud Limited, Glasgow, Scotland

[21] Appl. No.: 405,147

[22] Filed: Sep. 7, 1989

[30] Foreign Application Priority Data

Sep. 8, 1988 [GB] United Kingdom ............... 8821119
Mar. 23, 1989 [GB] United Kingdom ............... 8906818

[51] Int. Cl.⁵ .............................................. G02B 6/10
[52] U.S. Cl. ....................................... 385/130; 385/141; 252/299.01
[58] Field of Search .................. 350/96.12, 96.34; 385/130, 141; 252/299.01

[56] References Cited

U.S. PATENT DOCUMENTS

| | | | |
|---|---|---|---|
| 4,867,516 | 9/1989 | Baken | 350/96.34 X |
| 4,879,479 | 11/1989 | Frazier et al. | 350/96.34 X |
| 4,900,127 | 2/1990 | Robello et al. | 385/141 |
| 5,075,043 | 12/1991 | Robello et al. | 385/8 |
| 5,080,764 | 1/1992 | Kester et al. | 252/589 |

Primary Examiner—John D. Lee
Assistant Examiner—Stephen W. Barns
Attorney, Agent, or Firm—Bell, Seltzer, Park & Gibson

[57] ABSTRACT

An integrated optic component comprises a substrate (10) carrying a layer (11) of polymeric material which has an aliphatic or aromatic polymer backbone with bonded sidegroups exhibiting hyperpolarizability. The layer (11) shows a refractive index pattern induced by irradiation with wavelengths within the electronic absorption bands of the sidegroups and within the range of about 230 to 650 nm. The component may be poled so as to be an active component and may be in the form of a ridge guide. Typical sidegroups comprise 4'-amino or 4'-oxy substituted 4-nitrostilbene moieties, or 4'-amino substituted 4-cyanostilbene moieties, or N-substituted 1-(4-aminophenyl)-4-(4-nitrophenyl) buta-1, 3-diene moieties.

7 Claims, 2 Drawing Sheets

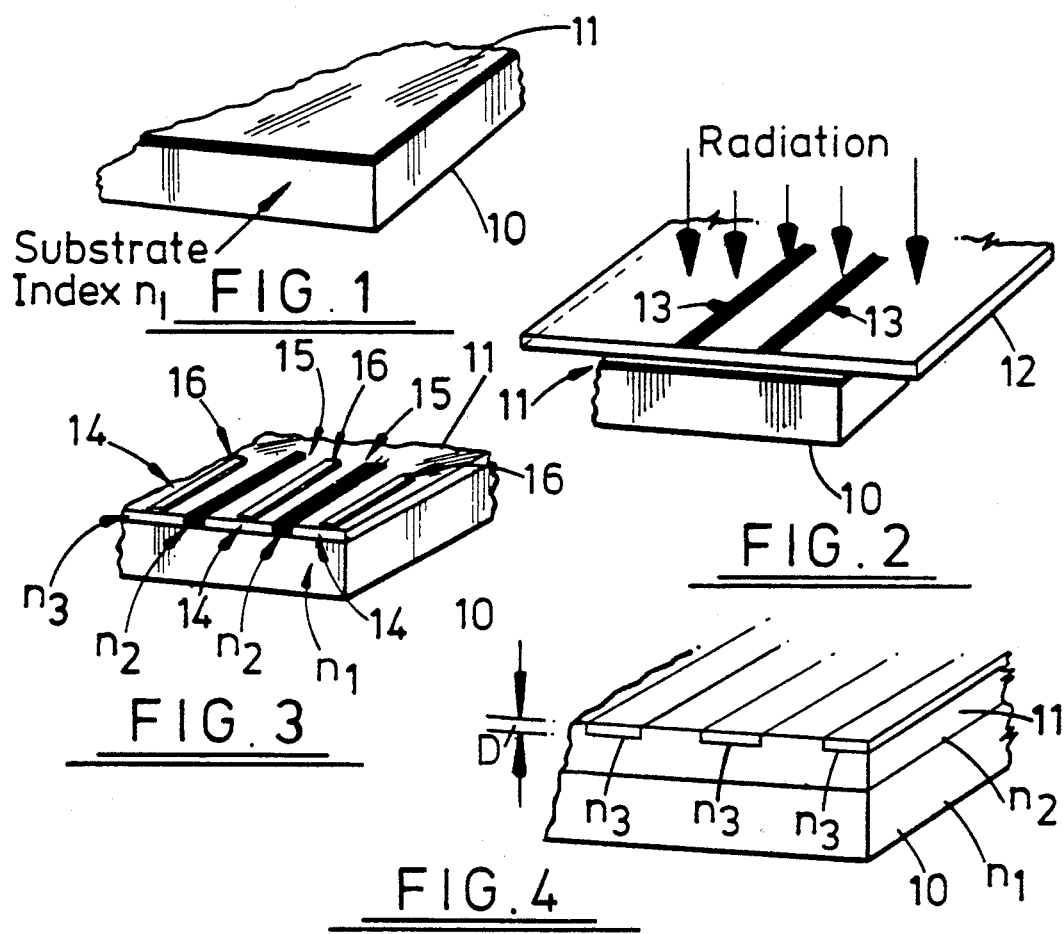
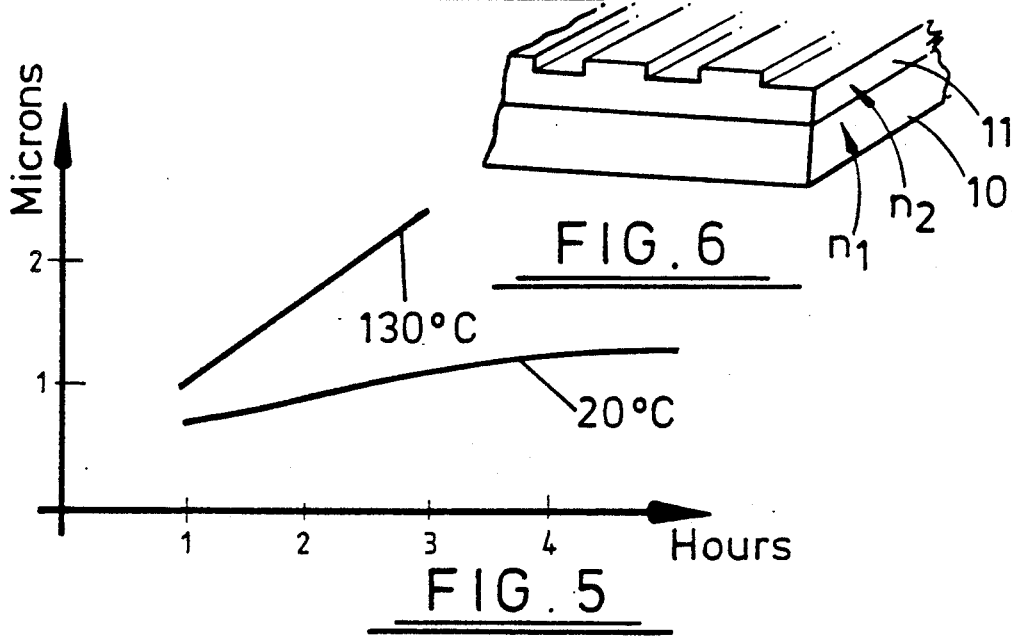

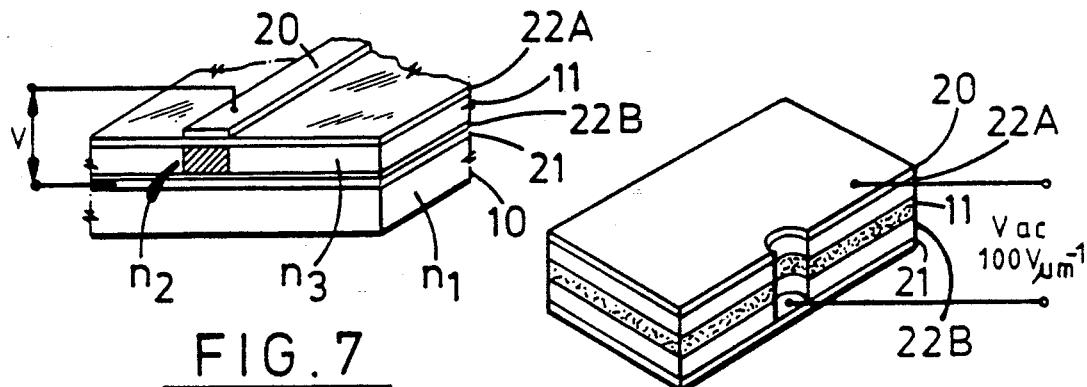
FIG. 7
FIG. 8
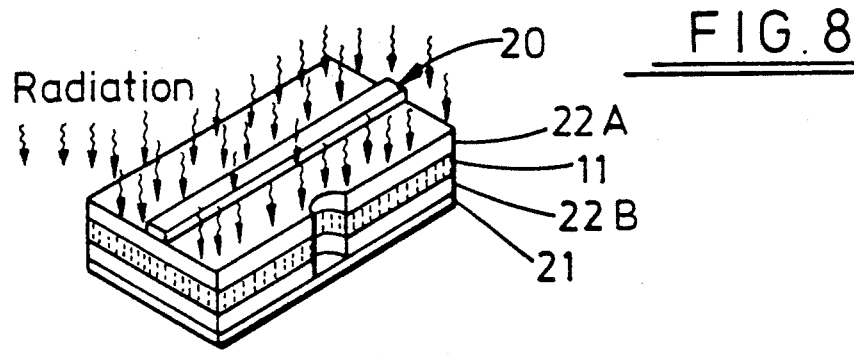
FIG. 9
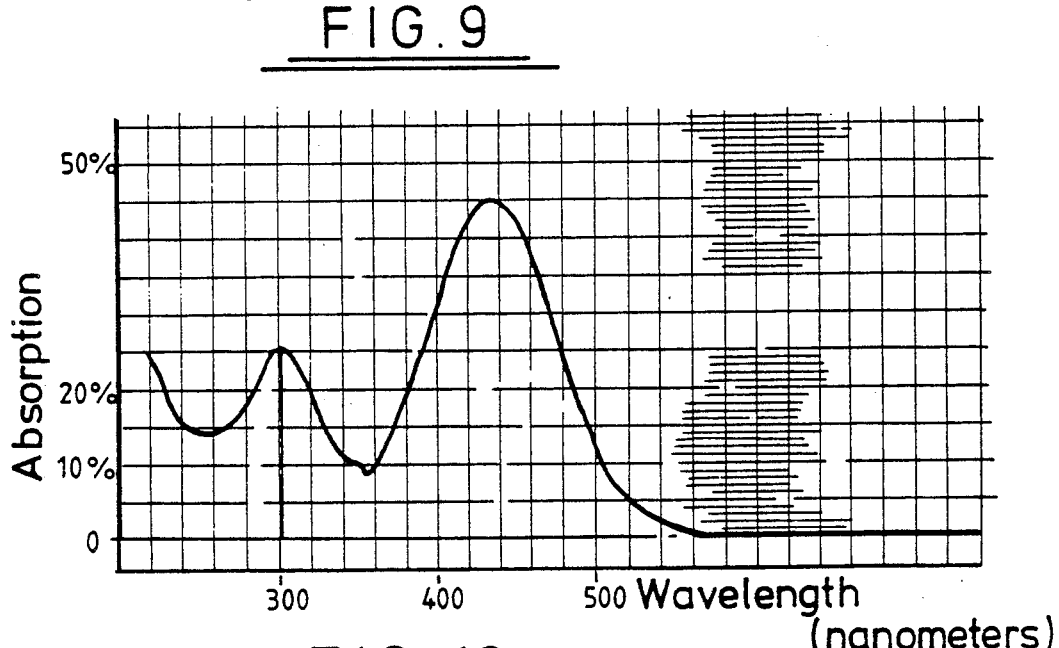
FIG. 10

INTEGRATED OPTIC COMPONENTS

This invention relates to integrated optic components.

Passive integrated optic components are well known and comprise a substrate one surface of which carries a refractive index pattern which defines the nature of the component. Typical patterns define waveguide circuits, waveguide gratings, and optical couplers. In order to fabricate such integrated optic components it has been proposed to apply a thin film of suitable material to the surface of a substrate and to photolithographically process the thin film so as to form the desired pattern. Other processing techniques proposed include laser beam writing or contact printing or holgraphic exposure. The materials which have been proposed, for example as described in 'Light Guiding Structures of Photoresist Films' Appl. Phys. Lett. Vol. 20 page 143 et seq and 'High-resolution photorefractive polymer for optical recording of waveguide gratings' Applied Optics Vol. 25 page 2960 et seq, suffer from various disadvantages such as very long processing times to obtain a usable refractive index pattern or very short retention duration of the refractive index pattern.

Active integrated optic components are also well known being fabricated in electro-optic material such as lithium niobate whereby the in-use function of the component is controllable by an external electrical field. It has recently been proposed to fabricate active integrated optic components using a thin film of suitable electro-optic material carried by one surface of a substrate, for example as described in 'Poled electro-optic waveguide formation in thin film organic media' Appl. Phys. Lett. Vol. 52 page 1031 et seq but the method therein described has the disadvantage that the guide properties and electro-optic interaction are combined and optimisation for both efficient guide formation and efficient guide operation under the electro-optic effect cannot be achieved.

In accordance with the present invention there is provided an integrated optic component comprising a substrate carrying on at least one surface thereof a thin film of a polymeric material having the possibility to be made electro-optic, characterised in that the polymeric material has an aliphatic or aromatic polymer backbone with bonded sidegroups exhibiting a hyperpolarizability, and that the material shows a refractive index pattern induced by irradiation with wavelengths within the electronic absorption bands of the sidegroups.

The sidegroups may be bonded to the backbone either directly or via a spacer, or the sidegroups may be partly incorporated in the backbone.

The aliphatic or aromatic polymer backbone may take any one of a number of different forms, for example, polyurethane, polyesters, polyacrylates, polyamides, polyethers or polysiloxanes.

Particular polymeric materials suitable for the integrated optic component according to the invention have sidegroups consisting of a system having the following structure:

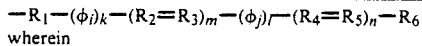

wherein

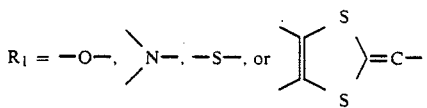

$\phi_i$ = a cyclic conjugated moiety, e.g., phenyl
k = 0 through 4

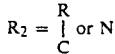

R = hydrogen, halogen, cyano, or lower alkyl m = 0 through 6
$\phi_j$ = a cyclic conjugated moiety, e.g., phenyl
l = 0 through 4

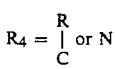

R = hydrogen, halogen, cyano, or lower alkyl n = 0 through 6

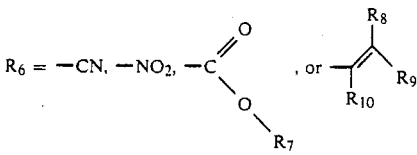

$R_7$ = alkyl
$R_8$ = H, or —CN
$R_9$ = H, or —CN
$R_{10}$ = H, or —CN

The sidegroups may comprise 4'-amino or 4'-oxy substituted 4-nitrostilbene moieties, or 4'-amino substituted 4-cyanostilbene moieties, or N-substituted 1-(4-amino-phenyl)-4-(4-nitrophenyl) buta-1, 3-diene moieties, for example 4'-amino substituted 4-nitrostilbene.

The invention is also related to a method of manufacturing an integrated optic component comprising a substrate carrying on at least one side thereof a thin layer of a polymeric material having the possibility to be made electro-optic. This method is characterised in that as polymeric material a material is chosen having an aliphatic or aromatic backbone with bonded sidegroups exhibiting hyperpolarizability, and that into said polymeric material a refractive index pattern is induced by selectively exposing said material with irradiation with wavelengths within the electronic absorption bands of the sidegroups.

By virtue of the present invention the processing time for obtaining usable refractive index patterns is substantially reduced, being of the order of a few tens of minutes (e.g. 50 minutes) and the duration of the refractive index pattern is at least in the order of years. The refractive index of the polymeric material is sensitive to irradiation in the waveband 230 to 650 nm, displays increased sensitivity with respect to refractive index changes in comparison to the known materials (by a factor of 10) and may in addition have electro-optic properties. Accordingly fabrication of the component of the present invention is achieved in a manner similar to that previously used for passive components but, with poling, produces an active component. Both efficient guide formation and efficient guide operation are thereby achieved in an active component.

The selective exposure of the polymeric material to the irradiation may be performed by a selective "writing" procedure, e.g., by a focussed laser beam or by holographic means. According to a particular method of manufacturing the selective exposure occurs by means of a mask having parts which are transparent and parts which are opaque to the applied irradiation.

Another aspect of the present invention comprises the fabrication of an active integrated optic component including the steps of successively forming on a substrate a first layer of electrode material, a first layer of buffer material, a layer of the polymeric material, a second layer of buffer material, and a second layer of electrode material, etching the second layer of electrode material to form an electrode of predetermined pattern, and directing irradiation with wavelengths within the electronic absorption bands of the sidegroups onto the exposed surface of the component to cause a change of the refractive index of those areas of the polymeric material which are not covered by the electrode of predetermined pattern, the buffer material of at least the second buffer material layer being non-opaque to the directed irradiation.

The present invention also comprises the fabrication of a passive integrated optic component, including the steps of forming on a substrate a layer of polymeric material having an aliphatic or aromatic polymer backbone with bonded sidegroups exhibiting a hyperpolarizability, irradiating the polymeric material partway over its thickness with irradiation with wavelengths within the electronic absorption bands of the sidegroups confined to a first predetermined pattern so as to cause a change of the refractive index of those areas of the polymeric material which are so exposed, applying a thin film of said polymeric material dissolved in a solvent to the surface of the polymeric material exposed to said irradiation for a measured time interval so as to dissolve the exposed area of index-changed material, and thereafter washing off the thin film to leave a relief surface structure which is free of index-changed material on the polymeric material.

By virtue of the ease of manufacture of integrated optical components using the aforesaid polymeric material and achieving patterning through irradiation exposure modification of an existing pattern is easily achieved at a local site by further irradiation at the site utilising for example focussed radiation from a laser source. This is particularly advantageous in the fabrication of large arrays of integrated optic elements, such as switches, where each element in the array is intended for example to have identical characteristics but due to inhomogeneities some elements display undesired characteristics. Localised trimming or tuning of these elements by application of further irradiation is easily performed to achieve the required characteristics.

Preferably the irradiation is applied to the polymeric material when the latter is at an elevated temperature since it has been discovered that the processing time for obtaining a particular refractive index pattern decreases as temperature increases.

It will be appreciated that the term 'hyperpolarisability' is known to those skilled in the art of optoelectronic materials; see for example an article by Le Barny et al in SPIE Vol. 682 Molecular and Polymeric Optoelectronic Materials: Fundamentals and Applications (1986) pp 56–64.

Embodiments of the present invention will now be described by way of example with reference to the accompanying drawings in which:

FIG. 1 illustrates a substrate supporting a layer of polymeric material in accordance with the present invention;

FIG. 2 shows selective irradiation of the FIG. 1 structure;

FIG. 3 illustrates a typical integrated optic component produced from the FIG. 2 process;

FIG. 4 shows an alternative form of component;

FIG. 5 is a graph illustrating a processing function used in manufacture of the FIG. 4 component;

FIG. 6 shows a further component derived from the FIG. 4 component;

FIG. 7 illustrates a still further form of integrated optic component;

FIGS. 8 and 9 illustrate process steps in the manufacture of the FIG. 7 component; and FIG. 10 illustrates a typical irradiation absorption spectrum for a polymeric material used in accordance with the present invention.

As is illustrated in FIG. 1 a substrate 10 having a refractive index of value $n_1$ is provided on its upper surface with a thin film or layer of polymer material 11. The material 11 has a polyurethane backbone to which side groups are chemically bonded, the side groups consisting of 4'-amino or 4'-oxy substituted 4 nitrostilbene, namely 4-nitro-4' aminostilbene or 4-nitro-4' oxystilbene. The side groups of the polymer material confer to the material a refractive index sensitivity so that prior to suitable irradiation the material is of uniform refractive index value $n_2$ but upon irradiation of selected areas of the polymer material with radiation in the 230–650 nm waveband the exposed areas are left with a refractive index of value $n_3$ (which is less than $n_2$). In the particular example schematically illustrated in FIG. 2 the irradiated areas are selected by a mask 12 having non-transmitting lines 13 thereon so that the radiation is transmitted by the mask between the lines 13 and thereby (as shown in FIG. 3) produces lines 14 on the polymer material 11 of index value $n_3$ separated by lines 15 of index value $n_2$ all carried by the substrate of index value $n_1$ and $n_2 > n_3 > n_1$.

The polymer material which has been described exhibits refractive index sensitivity in the wavelength range 280–450 nm which is particularly useful since it enables exposure by UV sources, for instance in mask aligners thereby facilitating integrated optic components to be fabricated with excellent reproducability, with a slightly-graded or sharp transition in the index profile at the $n_2/n_3$ interface which along the length of th transition is smooth and uniform from guide to guide. The waveguides thus formed are of relatively low loss per unit length. The processing time for irradiation is of the order of a few tens of minutes and because the side groups of the polymer material are bonded to the backbone, it has been found that the irradiated pattern is stable insofar as it is effectively permanently recorded.

Furthermore the side groups of the polymer materials described display electro-optic characteristics as a result of which the integrated optic components, after poling, can be electrically operated during use by means of electrodes 16 deposited thereon (FIG. 3), for example to form an electro-optic modulator or other active component.

FIGS. 1 to 3 are schematic and indicate that the irradiation exposure is applied for a sufficient duration to cause conversion of the whole depth of the n₂ index material to n₃ index but for most integrated optic applications it is sufficient to expose for a duration sufficient to effect only a predetermined depth of n₃ index within the body of n₂ index as is illustrated in FIG. 4. For any given depth D of n₃ index it has been found that the processing time or exposure time reduces as temperature of substrate 10 and material 11 increases. FIG. 5 illustrates comparative graphs of exposure time and depth for two temperatures, 20° C. and 130° C.

We have also found that the polymeric material 11 behaves like a photoresist in that after patterning by irradiation exposure as explained with reference to FIG. 4 the n₂/n₃ index pattern can be converted to a relief pattern of n₂ index by dissolving out the n₃ index areas simply by coating the n₂/n₃ index pattern with a developer in the form of a thin uniform film of the polymeric material dissolved in a suitable solvent such as cyclopentanone. After a period of time dependant upon the depth of the n₃ index areas the excess developer is removed for example by spinning to leave a layer of the n₂ index material with a relief pattern as shown in FIG. 6. This arises because the irradiation exposure in creating the n₃ areas modifies the solubility of these areas so that they are substantially more soluble than the unexposed n₂ areas. It will be understood that the resultant integrated optic component can be used as a raised ridge guide, or as a waveguide taper structure or as a surface relief hologram.

As has been indicated with reference to FIG. 3 if the component is to be used as an active optic component it requires electrodes 16. The electrodes 16 of FIG. 3 are essentially co-planar with the lines 15 of n₂ index and they interfere with the process of poling the material 11 which, of course, is necessary to align the side groups of the polymeric material so that its inherent electro-optic capabilites are usable. A preferred electrode arrangement is the plane-parallel format illustrated in FIG. 7 and which is manufactured as indicated in FIGS. 8 and 9.

In FIG. 7 the material 11 suitably index patterned as will be explained is separated from upper and lower electrodes 20, 21, by inactive buffer layers 22A, 22B. This is achieved by constructing on the substrate 10 the layered structure shown in FIG. 8 with the upper electrode 20 initially of the same area as the lower electrode 21. The material 11 is first poled by applying a poling voltage across the electrodes 20, 21, with the material 11 at elevated temperature. This aligns the side groups of the material 11. Next, with the poling voltage removed, the upper electrode 20 is patterned by dissolving out the unrequired metal. Buffer layer 22A acts as a chemical barrier during this process and the structure has the form shown in FIG. 9. Next, irradiation is applied over the whole area of the top surface of the FIG. 9 structure which results in conversion of the n₁ index areas exposed to the irradiation to n₃ index areas and the only non-exposed n₂ area is that underlying the patterned electrode 20 as shown in FIG. 7. Thus the n₂ index area is automatically self aligned with the electrode 20. The electrode 20 is made of metal, for example gold, and the buffer layer 22A is non-opaque to the radiation, being made for example of polyurethane.

With the self aligning fabrication process described with reference to FIGS. 8 and 9 production of integrated electric and optic components is greatly simplified by removing failures due to misalignment of the patterned electrode and the n₂ index area.

In a modification of the FIG. 7 component electrode 21 is omitted as is the step of poling the polymeric material 11. In this case the resultant component is rendered thermoactive by current flow along the top conductor 20.

The irradiation which has been referred to hereinbefore is preferably in the range between about 250 to 570 nm. The main effects however are apparent in the range of about 280 to 450 nm. In particular when the polymer contains side groups of 4'-oxy substituted 4-nitrostilbene, irradiation at about 373 nm results in a maximum sensitivity to refractive index changes. When the polymer contains side groups of 4'-amino substituted 4-nitrostilbene, irradiation at about 429 nm has provided excellent results both with respect to refractive index changes and low optical losses at the operating wavelength. By way of example only, FIG. 10 illustrates the absorption spectrum of one tested sample of the amino substituted polymeric material illustrating that absorption peaks occur at 300 nm and 430 nm which are primarily due to the electronic absorption bands of the sidegroups of the material.

In the case of a polymer of the 4'-amino substituted 4-cyanostilbene type irradiation at about 384 nm wavelength appeared to result in a maximum sensitivity to refractive index changes, whereas for a polymer with sidegroups comprising N-substituted 1-(4-aminophenyl)-4-(4-nitrophenyl) buta-1, 3-diene moieties the maximum sensitivity to refractive index changes appeared at a wavelength of 442 nm. By way of example, tested samples of the amino substituted polymeric material displayed for a transmission wavelength in the range 1.3 μm to 1.5 μm an index decrease of 0.03, and for a transmission wavelength of 0.6328 μm an index decrease of 0.09. Channel waveguides have been made from 4'-amino substituted 4-nitrostilbene which showed losses below 1dB/cm.

We claim:

1. An integrated optic component comprising a substrate carrying on at least one surface thereof a thin film of a polymeric material having the possibility to be made electro-optic, characterised in that the polymeric material has an aliphatic or aromatic polymer backbone with bonded sidegroups exhibiting a hyperpolarizability, and that the material shows a refractive index pattern induced by irradiation with wavelengths within the electronic absorption bands of the sidegroups.

2. An integrated optic component as claimed in claim 1, characterised in that the sidegroups consist of a system of the following structure:

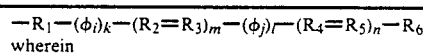
wherein

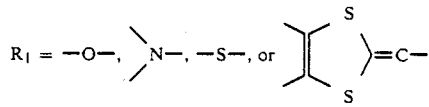

$\phi_i$ = a cyclic conjugated moiety, e.g., phenyl
k = 0 through 4

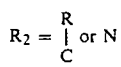

-continued

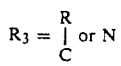
R = hydrogen, halogen, cyano, or lower alkyl m = 0 through 6
ϕⱼ = a cyclic conjugated moiety, e.g., phenyl
l = 0 through 4

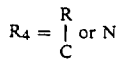

$R_5 = \underset{C}{\overset{R}{|}}$ or N    R = hydrogen, halogen, cyano, or lower alkyl n = 0 through 6

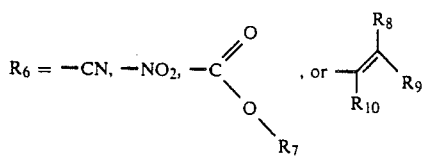

$R_7$ = alkyl
$R_8$ = H, or —CN
$R_9$ = H, or —CN

-continued $R_{10}$ = H, or —CN

3. An integrated optic component as claimed in claim 2, characterised in that the side groups comprise 4'-amino or 4'-oxy substituted 4-nitrostilbene moieties, or 4'-amino substituted 4-cyanostilbene moieties, or N-substituted 1-(4-amino-phenyl)-4-(4-nitrophenyl) buta-1,3-diene moieties.

4. An integrated optic component as claimed in claim 3, characterised in that the sidegroups consist of 4'-amino substituted 4-nitrostilbene.

5. An integrated optic component according to one of the claims 1 to 4, characterised in that the polymeric material shows a refractive index pattern induced by irradiation having a wavelength within the range of about 230 to 650 nm.

6. An integrated optic component according to claim 5, characterised in that the polymeric material shows a refractive index pattern induced by irradiation having a wavelength within the range of about 250 to 570 nm.

7. An integrated optic component according to claim 6, characterised in that the polymeric material shows a refractive index pattern induced by irradiation having a wavelength within the range of about 280 to 450 nm.

* * * * *

UNITED STATES PATENT AND TRADEMARK OFFICE
CERTIFICATE OF CORRECTION

PATENT NO. : 5,142,605
DATED : Aug. 25, 1992
INVENTOR(S) : Diemeer et al.

It is certified that error appears in the above-indentified patent and that said Letters Patent is hereby corrected as shown below:

Column 1, line 67, delete "$-R_1-(\varphi_1)_k-(R_2=R_3)_m-(\varphi_j)-(R_4=R_5)_n-R_6$" and substitute therefor -- $-R_1-(\varphi_1)_k-(R_2=R_3)_m-(\varphi_j)_\ell-(R_4=R_5)_n-R_6$ --.

Column 2, line 18, delete "1" and substitute therefor -- $\ell$ --.

Column 6, line 56, delete "$-R_1-(\varphi_1)_k-(R_2=R_3)_m-(\varphi_j)-(R_4=R_5)_n-R_6$" and substitute therefor -- $-R_1-(\varphi_1)_k-(R_2=R_3)_m-(\varphi_j)_\ell-(R_4=R_5)_n-R_6$ --.

Column 7, line 8, delete "1 = 0 through 4" and substitute therefor -- $\ell$ = 0 through 4 --.

Signed and Sealed this

Twenty-fifth Day of January, 1994

Attest:

*Attesting Officer*

BRUCE LEHMAN

*Commissioner of Patents and Trademarks*